United States Patent [19]

Olson

[11] 4,414,264

[45] Nov. 8, 1983

[54] CHIP CARRIER SUBSTRATES OF HYBRID WOVEN GLASS CLOTHS

[75] Inventor: Larry D. Olson, Viroqua, Wis.

[73] Assignee: UOP Inc., Des Plaines, Ill.

[21] Appl. No.: 457,778

[22] Filed: Jan. 13, 1983

Related U.S. Application Data

[63] Continuation-in-part of Ser. No. 334,500, Dec. 28, 1981, Pat. No. 4,372,347.

[51] Int. Cl.$^3$ .............................................. B32B 5/16
[52] U.S. Cl. ...................... 428/241; 139/420 C; 428/225; 428/257; 428/252; 428/259; 428/446; 428/901
[58] Field of Search ................ 139/420 C; 428/225, 428/245, 257, 258, 259, 901, 241, 446

[56] References Cited

U.S. PATENT DOCUMENTS

4,201,247  5/1980  Shannon .............................. 428/288
4,304,811  12/1981  David et al. ........................ 428/258

*Primary Examiner*—James J. Bell
*Attorney, Agent, or Firm*—James R. Hoatson, Jr.; Raymond H. Nelson; William H. Page, II

[57] ABSTRACT

Multilayer laminates and substrates for carriers of silicon chips which are used in circuitry boards will comprise woven hybrid glass cloth formed from fiberglass and a second material which possesses a coefficient of thermal expansion of less than about $5.0 \times 10^{-6}$ in./in/°C. The resulting laminates will be thermally and dimensionally stable. As an example, a hybrid glass cloth may be formed in which the warp yarn of said cloth is fiberglass and the fill yarn is boron nitride. The resulting cloth may be used to form laminates which possess a coefficient of thermal expansion similar in nature to that of a chip carrier such as ceramic, thus minimizing the danger of a solder fracture.

10 Claims, No Drawings

CHIP CARRIER SUBSTRATES OF HYBRID WOVEN GLASS CLOTHS

CROSS-REFERENCE TO RELATED APPLICATION

This application is a continuation-in-part of my co-pending application Ser. No. 334,500 filed Dec. 28, 1981 and issued on Feb. 8, 1983 as U.S. Pat. No. 4,372,347, all teachings of which are incorporated by reference herein.

BACKGROUND OF THE INVENTION

Laminates are used as carriers for silicon chips (integrated circuits) which are used in dual in-line packages for integrated circuits. The dual in-line packages in typical fashion are components small in size, measuring in some instances $1'' \times \frac{1}{2}''$ and have integrated circuitry silicon chips mounted on these packages. The silicon chips are programmable so that they carry or maintain a bank of information and must be electrically connected to the circuit board so that the information contained in the chip can be passed through the circuit board to control various electrical and electronic devices such as computers, instruments, communication devices, airplane guidance systems, etc.

In view of the complexity of the circuitry, it is advantageous to reduce the area which is required to hold a given amount of information. One method of accomplishing this goal is to change the method of packaging and attaching the integrated circuitry chips to the circuit board. The relatively large dual in-line packages, that is, packages which are as large as $1'' \times 3''$, ordinarily have leads that plug into plates through holes in the circuit board and should, in order to render the circuit more efficient, be replaced by more compact integrated circuitry chips. For example, some dual in-line packages have as many as 64 leads and instead of inserting all of these leads into the circuit board, the latest construction circuitry is to package some of the integrated circuitry chips into chip carriers which are then mounted to the circuit board surface. This eliminates the cumbersome process of plugging all the leads into holes in the circuit board and provides an easier process for connecting the chip to the circuit board. In addition to providing this easier process, it is possible to increase the number of leads and concurrently increase the amount of information that can be transmitted from a given area on the circuit board.

Heretofore, silicon chips have been mounted on a chip carrier such as ceramics or plastics which, in turn, have been mounted on a chip carrier substrate or circuit board. However, in some instances, it is important that the chip carrier is hermetically sealable. Only ceramic chip carriers are hermetically sealable in today's state of the art. The coefficient of thermal expansion of ceramic is $6.4 \times 10^{-6}$ in/in/°C. The CTE of standard laminates is $13-15 \times 10^{-6}$ in/in/°C. This thermal mismatch results in the inability of the package to be able to withstand temperature cycling. The reason for this is that when the package (the silicon chip which is mounted to the chip carrier which is, in turn, mounted to the chip carrier substrate) is subjected to temperature extremes, the solder joints may fracture due to the varying thermal expansion properties of the current materials involved with the resulting disadvantage that an electrical open occurs. The electrical open occurs when stress is produced due to the temperature fluctuations, the stress being exerted on the solder joints which connect the materials inasmuch as said materials expand and contract at different rates. After repeated temperature cycling, the solder joint can break, thus causing the electrical open. In order to minimize the aforementioned stress which is exerted on the solder joint, it is necessary to utilize a chip carrier and a chip carrier substrate which will have the same rate or minimally different rates of expansion and contraction. This will insure that the solder joints will not fracture during the thermal cycling.

Another area in which thermal expansion plays an important role is that of multi-layer laminated boards which may be used as printed wiring boards which are utilized as components in various electrical and electronic devices. A major problem which is attendant with many of these laminates which are made of multi-layer substrates is the dimensional stability of the inner layers of the composite board. For example, a multi-layer board may consist of up to 20 layers of substrate materials. When processing these inner layers to form the desired board substrate, the layers are subjected to a thermal stress. During this thermal stress, the inner layers may expand or contract. For example, when utilizing a glass cloth such as a fiberglass cloth, the cloth will exert an effect on the dimensional stability of the inner layers. In this respect, a glass cloth which will expand more than 0.0005 inch/inch will cause registration problems of the pads in the various layers, said poor registration resulting in the inability to connect the inner layers which is cause for either failure or rejection.

It is therefore readily apparent that if a material can be obtained which possesses a better dimensional stability, the material may be used in preparing carrier substrates for silicon chips as well as being used as a component in preparing multilayer printed wiring boards. It has now been discovered that a hybrid glass cloth which is woven from certain materials will possess the desired thermal dimensional stability and thus may be used as chip carrier substrates and dimensionally stable laminates.

SUMMARY OF THE INVENTION

This invention relates to substrates which may be employed as carriers for silicon chips and as dimensionally stable laminates. Specifically, the invention is concerned with chip carrier substrates and laminates which are dimensionally stable when subjected to thermal cycling. It is therefore an object of this invention to provide a substrate for carrying silicon chips which possess desirable characteristics.

A further object of this invention is to provide a dimensionally stable laminate which may be used as a circuit board or as a chip carrier substrate.

In one aspect, an embodiment of this invention resides in a substrate for carrying a silicon chip which comprises a hydrid glass cloth woven from yarn comprising fiberglass and a second material which possesses a coefficient of thermal expansion of less than about $5.0 \times 10^{-6}$ in/in/°C.

A specific embodiment of this invention is found in a substrate for carrying a silicon chip which comprises a hybrid glass cloth woven from yarn in which the warp yarn of said cloth is fiberglass and the fill yarn is boron nitride, the thickness of said hybrid woven glass cloth being in a range of from about 0.0015'' to about 0.020''.

Another specific embodiment of this invention is found in a dimensionally stable laminate which comprises alternate layers of fiberglass and a woven hybrid glass cloth in which the warp yarn of said cloth is fiberglass and the fill yarn is boron nitride, the thickness of said dimensionally stable laminate being in a range of from about 0.003" to about 0.250".

Other objects and embodiments will be found in the following further detailed description of the present invention.

DETAILED DESCRIPTION OF THE INVENTION

As hereinbefore set forth, the present invention is concerned with carrier substrates which may be employed to carry silicon chips and also to laminates which may be prepared, said chip carrier substrates and laminates possessing a dimensional stability which is sufficient to overcome thermal expansion problems which may arise when utilizing other materials. Heretofore, when a chip carrier and a substrate are prepared from dissimilar materials, for example, the chip carrier being ceramic in today's state of the art while the substrate is reinforced with a woven cloth material, a solder joint fracture with an ensuing electrical open can occur. This phenomenon is noticed when the circuit board is subjected to temperature fluctuations over a relatively long period of time. The fracture occurs due to a stress which is exerted on the solder joint which connects the materials, said stress being produced when the materials expand and contract at varying rates due to the repeated temperature cycling.

The difficulty attendant to possible stress with a resulting fracture of the solder joint is overcome by utilizing materials which possess a dimensional stability which is about equal for materials on either side of the solder joint. The chip carrier substrates of the present invention are prepared from either woven hybrid cloth or nonwoven hybrid mats which, as hereinbefore set forth, possess a dimensional stability sufficient to overcome registration problems of the pads in the layers of a laminate or thermal expansion problems of previously employed chip carrier substrates.

The dimensional stability of the cloth is attained by combining fiberglass yarns with a second material. The coefficient of thermal expansion of fiberglass is $5.0 \times 10^{-6}$ in/in/°C. and by combining the fiberglass with a material containing a coefficient of expansion less than $5.0 \times 10^{-6}$ in/in/°C., it is possible to weave a glass cloth which will then possess the desired thermal stability. Examples of materials which possess the desired coefficient of thermal expansion (CTE) will include such materials as ceramic filaments, boron nitride filaments and nylon filaments. It is well known that nylon is a generic term for long-chain synthetic polymeric amides with recurring amide groups as an integral part of the main polymer chain. In this respect, there are several varieties of polymeric amides which are known in the trade as Nylon 6, Nylon 66, Nylon 610, Nylon 612, Nylon 11, Nylon 12, Nylon 7, Nylon 8, Nylon 9, Nylon 1313, etc. It is contemplated that many of the nylon filaments may be used, the only criterion being that the CTE is less than about $5.0 \times 10^{-6}$ in/in/°C. Some representative examples of the coefficient of thermal expansion of the various materials is that the CTE in the direction of the filament is $2.8 \times 10^{-6}$ in/in/°C., of boron nitride is $1.1 \times 10^{-6}$ in/in/°C. and of a nylon known in the trade as Kevlar is $0 \times 10^{-6}$ in/in/°C.

It is contemplated within the scope of this invention that the fiberglass and the second material which possesses the desired CTE can be combined in any manner, if so desired. One method of combining the two materials is to twist strands of filaments of the dissimilar materials together to make a yarn which may then be woven or, if so desired, a plied yarn may be prepared which consists of a fiberglass yarn and a yarn of the second material. The yarns thus prepared may then be woven in any manner known in the art to form the desired woven cloth, one such method being to interweave a warp yarn and a fill yarn utilizing conventional weaving machines to attain the desired product.

Another method of combining the two materials is by a process known in the weaving industry as "end and end". This process is a method of weaving a cloth in which the weaving is accomplished by not twisting the filaments. Therefore, by this method a cloth may be woven using any combination of yarns. For example, a cloth may be woven by alternating yarn made of fiberglass and a nylon or by using one yarn of fiberglass and a plurality of yarns of nylon before utilizing another yarn of fiberglass.

In either method of weaving a hybrid cloth, the warp yarn may be of fiberglass and the fill yarn of the combined dissimilar materials or both the warp yarn and the fill yarn may be the combined dissimilar materials.

The hybrid cloth which has been prepared according to the method heretofore described may then be used to form a multilayer laminate, said laminate being utilized as a substrate for a circuit board or as a substrate for a chip carrier. The ply which is utilized to form a laminate may be prepared by impregnating the hybrid woven cloth with a resin such as an epoxy resin, various polyimide resins, triazine resins, bis-maleimide-triazine resins, etc., the particular resin which is employed being dependent upon the particular application for which the laminate is to be used. The impregnation of the cloth may be effected in any manner known in the art such as passage through a solution of the resin at a predetermined temperature or by dipping the cloth in said resin solution. Following impregnation of the cloth with the desired resin, the cloth may then be passed through metering rolls so that the selected amount of resin is retained in the cloth, while any excess is squeezed therefrom. Generally speaking, the resin content of the woven cloth may be in a range of from about 10 to about 90% by weight of said cloth.

The impregnated cloth may then be subjected to a B-stage cure by placing the cloth in a heating oven which is maintained at a temperature in the range of about 250° to about 350° F. Thereafter, the impregnated cloth may be laid up utilizing a predetermined number of plies with at least one sheet of a conductive metal and pressed at a temperature which may range from about 300° to about 500° F. and a pressure in the range of from about 100 to about 2000 pounds per square inch to provide the desired laminate.

It is also contemplated that a ply which may be used to prepare a laminate may also be prepared in a continuous manner by impregnating the woven cloth of the present invention with a resin in a continuous manner, that is, by passing the cloth through the resin and continuously withdrawing said cloth from the resin bath after passage through the resin for a predetermined period of time. The cloth is then continuously passed through metering rolls to control the resin content and through a heater oven wherein the impregnated woven cloth is subjected to a B-stage cure. After passage through the heater oven for a time sufficient to effect the cure, the impregnated woven cloth is continuously withdrawn and utilized as a ply in the preparation of a laminate.

The multilayer laminate may then be prepared by placing a predetermined number of plies in a press and subjecting the plies to pressure at an elevated temperature for a predetermined period of time to form the desired laminate. For example, the plies may be laminated at a pressure in the range of from about 100 to about 2000 pounds per square inch at a temperature of from about 250° to about 450° C. for a period of time which may range from about 10 minutes up to about 10 hours or more to form a multilayer laminate which is less than about 0.031". In the event that a thicker article is desired, the number of plies may be increased to form an article known in the trade as a rigid board.

It is also contemplated within the scope of this invention that a multilayer laminate may also be prepared which will possess the desired thermal or dimensional stability by utilizing alternate layers of the woven hybrid glass cloth, the other layers in the laminate comprising a dissimilar material such as fiberglass or other material which will not substantially alter the coefficient of thermal expansion of the finished article.

The multilayer laminate which possesses the desired coefficient of thermal expansion may then be utilized as a chip carrier substrate by forming a multilayer circuit board and mounting a silicon chip contained in a ceramic or plastic chip carrier. When utilizing the multilayer laminate which has been prepared according to the process herein described as a chip carrier substrate, it is preferred that the chip carrier itself be formed of ceramic inasmuch as the coefficient of thermal expansion of ceramic is $6.4 \times 10^{-6}$ in/in°C. and the coefficient of thermal expansion of the multilayer laminate so described has approximately the same value. The multilayer laminates which may be used for circuit boards or as chip carrier substrates may then be used in a wide variety of electrical or electronic equipment of the type previously described, the resulting circuit board possessing a dimensional stability as well as a thermal stability which will permit the use of the same in situations where the equipment is subjected to thermal cycling without succumbing to stress factors which may result in a solder of the fracture joint with the resulting disruption of electrical current.

The following examples are given to illustrate the preparation of a woven hybrid glass cloth and to the preparation of multilayer laminates as well as the use thereof as a chip carrier substrate. However, it is to be understood that the examples are given merely for purposes of illustration and that the present process is not necessarily limited thereto.

EXAMPLE I

To prepare a woven hybrid glass cloth which may be used in multilayer laminates and as a substrate for chip carrier, a Kevlar yarn having a 195 denier was plied with a fiberglass yarn of 225 denier. The yarns were twisted together to form a yarn which was used for the warp, while the fill yarn consisted only of Kevlar. The two yarns were woven together in a conventional mill to form a hybrid glass cloth containing 28 yarns per square inch and a weight of 2.9 ounces per square yard. The thus woven hybrid cloth was impregnated with an epoxy resin by dipping the cloth in a solution of epoxy resin which was maintained at a temperature of 72° F. The thus impregnated cloth was then passed through metering rolls to adjust the resin content of the cloth to 48%. Following this, the cloth was then subjected to a B-stage cure at a temperature of 350° F. for a period of 3 minutes. Thereafter, the plies of epoxy-impregnated cloth were laminated together at 900 psi and 60 minutes at 350° F. followed by a postcure for a period of two hours at 350° F.

The impregnated cloth prepared according to the above paragraph was then tested to determine the coefficient of thermal expansion which was found to be 4 to $5 \times 10^{-6}$ in/in/°C. in the X direction and 5.7 to $8 \times 10^{-6}$ in/in/°C. in the Y direction.

EXAMPLE II

In a manner similar to that set forth in example I above, the hybrid glass cloth may be prepared by plying two yarns of a 195 denier Kevlar filament twisted with a 225 denier fiberglass filament which is used for the warp and the fill in the hybrid glass cloth. After weaving the hybrid glass cloth, it may then be impregnated with a polyimide resin by dipping the cloth in a solution of said resin followed by passage through a metering roll, a B-stage cure, lamination and a postcure. Similar cloths may also be impregnated with other resins such as triazine resins and bis-maleimide-triazine resins to form plies which may be used in producing a laminate, said laminate having a coefficient of thermal expansion which is within a predetermined measurement, thus rendering the impregnated cloth more stable than a cloth which is formed from all fiberglass.

EXAMPLE III

Likewise, a hybrid woven cloth may be prepared by alternating yarns of fiberglass and a high temperature nylon known in the trade as Kevlar in the weaving process. The yarn thus produced can be used for both the warp and fill yarns in producing the cloth. Thereafter, the cloth may be impregnated with an epoxy resin by passing the cloth through a solution of the resin followed by passage through a metering roll, a B-stage cure, lamination and a postcure.

EXAMPLE IV

A multilayer laminate may be prepared by impregnating a woven hybrid cloth in which the fill yarn consists of Kevlar and the warp yarn comprises Kevlar plied with a fiberglass yarn. The woven hybrid may then be impregnated with an epoxy resin and subjected to a B-stage cure to form a pre-preg. Following this, copper foil may be laid up on one or both sides of a predetermined number of the pre-preg plies which may then be laminated together by subjecting the pre-preg or B-stage material to pressure which may range from about 100 to about 2000 pounds per square inch at an elevated temperature of about 300° C. and thereafter the copper foil which has become bonded to the resulting laminate may be etched into a desired circuit pattern by conventional means. The resulting multilayer board may then be used as a chip carrier in which the silicon chips are mounted directly on the surface of the multilayered board in predetermined positions. Alternatively, if so desired, the silicon chips may be mounted in a ceramic or plastic carrier which may then be mounted on the surface of the multilayered board by conventional means.

I claim as my invention:

1. The application of a substrate for carrying a silicon chip (integrated circuits) which comprises a hybrid glass cloth woven from yarn comprising fiberglass and a second material which possesses a coefficient of thermal expansion of less than about $5.0 \times 10^{-6}$ in/in/°C.

2. The substrate as set forth in claim 1 comprising a dimensionally stable laminate.

3. The substrate as set forth in claim 1 in which the warp yarn of said hybrid glass cloth is fiberglass and the fill yarn is boron nitride.

4. The substrate as set forth in claim 1 in which the warp yarn of said hybrid glass cloth is a mixture of fiberglass and boron nitride and said fill yarn is a boron nitride filament.

5. The substrate as set forth in claim 1 in which the warp yarn is fiberglass and the fill yarn is a nylon filament.

6. The substrate as set forth in claim 1 in which the warp yarn is a mixture of fiberglass and nylon and the fill yarn is a nylon filament.

7. The substrate as set forth in claim 1 in which warp and/or fill yarns are a hybrid of alternating yarns (end and end).

8. The substrate as set forth in claim 1 in which the thickness of said woven hybrid glass cloth is in a range of from about 0.0015" to about 0.20".

9. The substrate as set forth in claim 2 in which said dimensionally stable laminate comprises alternate layers of said woven hybrid glass cloth and a fiberglass.

10. The substrate as set forth in claim 9 in which the thickness of said dimensionally stable laminate is in a range of from about 0.003" to about 0.250".

* * * * *